United States Patent [19]

Ohashi

[11] 4,143,555
[45] Mar. 13, 1979

[54] DUAL BAND PUSHBUTTON TUNER

[75] Inventor: Tamaki Ohashi, Tokyo, Japan

[73] Assignee: Nihon Technical Kabushiki Kaisha, Japan

[21] Appl. No.: 740,747

[22] Filed: Nov. 10, 1976

[30] Foreign Application Priority Data

| Nov. 13, 1975 | [JP] | Japan | 50-135717 |
|---|---|---|---|
| Jul. 19, 1976 | [JP] | Japan | 51-85160 |
| Aug. 20, 1976 | [JP] | Japan | 51-98649 |

[51] Int. Cl.² .......................................... F16H 35/18
[52] U.S. Cl. ............................... 74/10.33; 74/10.35; 74/10.31; 74/10.37
[58] Field of Search ............... 74/10.33, 10.31, 10.35, 74/10.37; 334/7

[56] References Cited

U.S. PATENT DOCUMENTS

| Re. 27,179 | 9/1971 | Newman | 74/10.33 |
|---|---|---|---|
| 3,415,129 | 12/1968 | Stamm | 334/7 |
| 3,463,017 | 8/1969 | Stamm | 74/10.33 |
| 3,554,041 | 2/1966 | Stamm | 74/10.33 |
| 3,646,821 | 3/1972 | Clark | 334/7 |
| 3,722,299 | 3/1973 | Knight | 334/7 |
| 4,003,266 | 1/1977 | Yamagishi | 74/10.33 |
| 4,010,652 | 3/1977 | Sugimoto | 74/10.33 |
| 4,041,784 | 8/1977 | Ohashi | 74/10.33 |

*Primary Examiner*—Samuel Scott
*Assistant Examiner*—K. C. Turner
*Attorney, Agent, or Firm*—Robert E. Burns; Emmanuel J. Lobato; Bruce L. Adams

[57] ABSTRACT

A dual band pushbutton tuner is disclosed having a pair of tuning slide assemblies disposed on the opposite sides of a pushbutton slide and which can be selectively actuated in conjunction with an operation of the pushbutton slide, without using a shuttle. Each of the tuning slide assemblies is normally connected with the pushbutton slide through connection means, which is constructed such that when one of the tuning slide assemblies is constrained by constraining means, the other tuning slide assembly is permitted to move in response to an operation of the pushbutton slide. The pair of tuning slide assemblies alternately assume this manner of operation as the constraining means is switched.

13 Claims, 12 Drawing Figures

DUAL BAND PUSHBUTTON TUNER

FIELD AND BACKGROUND OF THE INVENTION

The invention relates to a pushbutton tuner, and more particularly, to a dual band pushbutton tuner having a pair of tuning slide members which can be selectively actuated by a pushbutton slide.

In dual band pushbutton tuners of known form, each pushbutton slide is engageable with a selected one of a pair of tuning slide members disposed on the opposite side thereof and disengageable from the other tuning slide member by means of a shuttle or shuttles which move together with a manually operated shift member. In U.S. Pat. No. Re. 27,179 and U.S. Pat. No. 3,415,129, the shuttle comprises a toggle lever mounted on the pushbutton slide and alternately tilts or oscillates from one of the tuning slide members to the other. In order to hold the lever at a definite operative position, a snap action or over-center effect is produced between the lever and the pushbutton slide. In U.S. Pat. No. 3,463,017, the shuttle comprises a rigid horizontal bar which is slidably carried within a groove formed in the pushbutton slide for alternate axial movement across the pushbutton slide from one of the tuning slide members to the other. U.S. Pat. No. 3,646,821 and German Laid-Open Patent Application No. 2,522,273 disclose a shuttle comprising a flat plate which is pivotally mounted on the pushbutton slide. The plate is adapted to rock on the pushbutton slide between the pair of tunning slide members. German Laid-Open Patent Application No. 2,522,274 discloses a pair of shuttles carried by the pair of tuning slide members through spring materials, and a selected one of the shuttles is engageable with the pushbutton slide by undergoing an elastic movement.

With these shuttles of various forms as mentioned above, they are moved by the shift member between one of their operative positions and the other or between their inoperative and operative positions when switching a tuning slide member which is to engage the pushbutton slide. A usual pushbutton tuner includes as many as five or ten shuttles associated with five pushbutton slides, for example, so that this increased number of shuttles must be simultaneously moved by the shift member, requiring an increased force to operate the shift member. It will be apparent that the force requirement will be even greater when each shuttle has a snap action or over-center effect. With pushbutton tuners of the type in which the respective shuttles slide along the surface or grooves formed in the pushbutton slides, the resulting friction also requires an increased force to operate the shift member.

SUMMARY OF THE INVENTION

Therefore, it is an object of the invention to provide a dual band pushbutton tuner which avoids the above disadvantages by providing a pair of tuning slide assemblies disposed on the opposite sides of a pushbutton slide and which can be selectively operated in conjunction with the operation of the pushbutton slide without using a shuttle.

In accordance with the invention, there is provided a dual band pushbutton tuner which comprises a support, a pushbutton slide mounted on the support so as to be movable between its inoperative and its operative position and normally urged to its inoperative position, a pair of tuning slide assemblies disposed on the opposite sides of the pushbutton slide and mounted on the support so as to be movable between their inoperative and operative position in conjunction with the pushbutton slide, means for connecting the pair of tuning slide assemblies with the pushbutton slide in a manner such that when one of the tuning slide assemblies is constrained, the other tuning slide assembly is permitted to move between its inoperative and its operative position in conjunction with the pushbutton slide, and means for alternately constraining the pair of tuning slide assemblies.

In a preferred embodiment of the invention, the means for connecting the pair of tuning slide assemblies with the pushbutton slide comprises a lever pivotally mounted on a pin which is fixed to the pushbutton slide, the lever extending in relation to the pair of tuning slide assemblies and having slots formed in their respective ends for engagement with pins which extend from the corresponding tuning slide assemblies. When a selected one of the tuning slide assemblies is constrained, the lever moves about the pin as the pushbutton slide is moved from its inoperative to its operative position, thereby driving the other tuning slide assembly from its inoperative to its operative position. At this time, the pin extending from said one of the tuning slide assemblies is in sliding engagement with a slot formed in one end of the lever to constrain this end, so that the stroke through which the pushbutton slide travels, or the distance between the inoperative and the operative position of the pushbutton slide, is reduced to nearly one-half the distance between the inoperative and the operative position of the tuning slide assembly. The same applies to the other tuning slide assembly, so that the depression of the pushbutton through a reduced stroke is sufficient to achieve a desired operating condition.

The connection means may also comprise racks and a pinion. The pinion is pivotally mounted on the pushbutton slide and meshes with racks which are provided on the respective tuning slide assemblies. When one of the tunning slide assemblies is constrained, the other tuning slide assembly is permitted to move in conjunction with a movement of the pushbutton slide.

Means for alternately constraining the pair of tuning slide assemblies may take a simple form. Specifically, such means may comprise a plate which is movably mounted on a support so as to traverse across the pair of tuning slide assemblies. The plate is formed with a notch or an aperture having a detent edge which may be engaged by one of the tuning slide assemblies to permit a free movement of the other tuning slide assembly through the notch or aperture. While the constraining plate may appear to be similar to a shift plate in a dual band pushbutton tuner of a known form, it does not operate to actuate a shuttle as in the case of the shift plate. Instead, it is merely alternately moved between an operative position in which it engages one of the tuning slide assemblies and the other operative position in which it engages the other tuning slide assembly, so that it is subject to no significant load, enabling a smooth operation of it by an operator.

The above and other objects, features and advantages of the invention will become apparent from the following description of embodiment thereof with reference to the attached drawings.

DETAILED DESCRIPTION OF PREFERRED EMBODIMENTS

Figure 1:
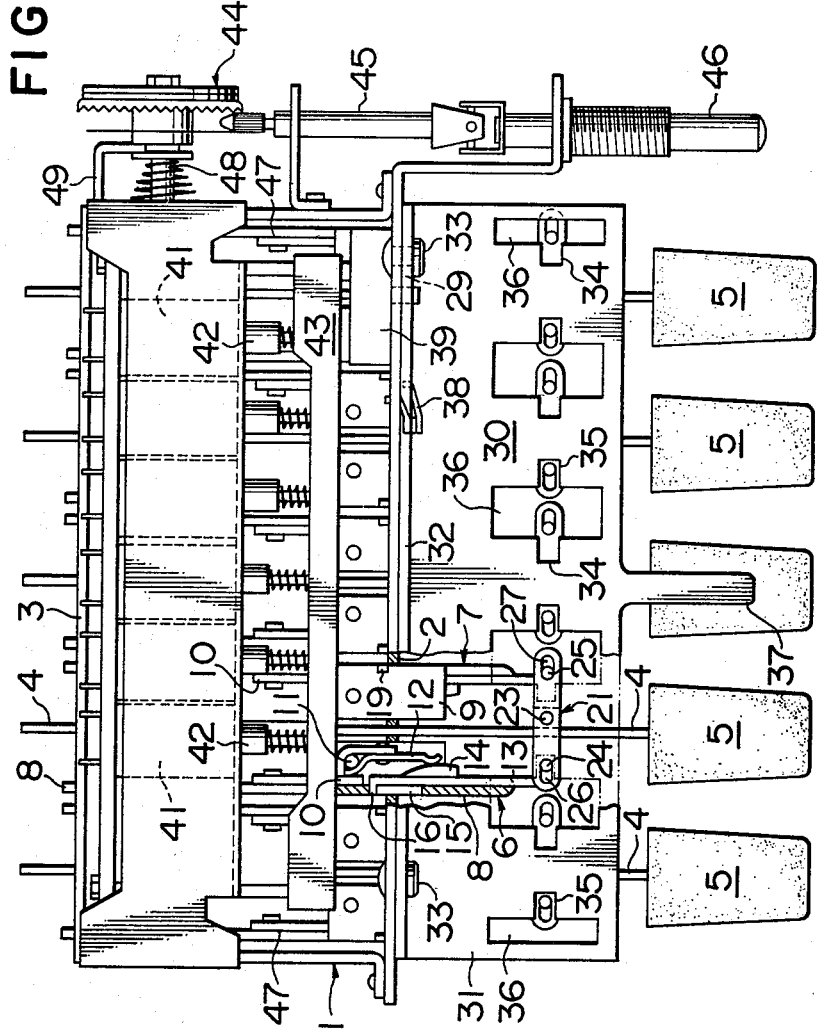
FIG. 1 is a plan view of a dual band pushbutton tuner constructed in accordance with one embodiment of the invention, with part being broken away to show the cross section.
Figure 2:
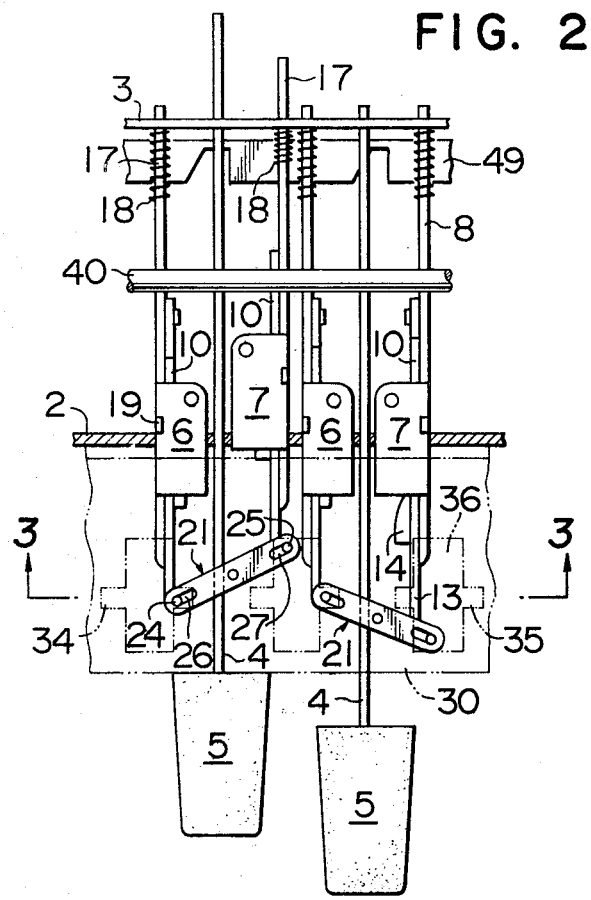
FIG. 2 is a plan view of a pair of adjacent pushbutton actuator units of the pushbutton tuner shown in FIG. 1 which assume an operative position and a reset position, respectively.

Throughout the description of the several embodiments of the invention, it is to be noted that corresponding parts in the several embodiments are designated by like reference characters wherever applicable in order to simplify the description. Referring to FIG. 1, there is shown a dual band pushbutton tuner constructed in accordance with one embodiment of the invention. The tuner includes a support 1 having a pair of vertical walls 2, 3 through which extend a plurality of flat pushbutton slides 4, which are disposed in substantially parallel relationship with each other. Each of the pushbutton slides 4 carries a pushbutton 5 on its forward end, and is guided in a suitable passage in the vertical walls 2, 3 so as to be independently slidable between its inoperative position shown in FIG. 1 and a rearward operative position (shown for the left-hand pushbutton slide 4 of FIG. 2), and between the inoperative position and a forward reset position (shown for the right-hand pushbutton slide 4 of FIG. 2). These pushbutton slides 4 are normally urged by springs, not shown, to remain in their inoperative position. A pair of tuning slide assemblies 6, 7 are disposed parallel to each other on the opposite sides of each pushbutton slide 4. The construction of the pair of tuning slide assemblies 6, 7 is well known, and usually comprises a body member 8 received in suitable guide passages formed in the vertical walls 2, 3 so as to be freely slidable and having a flat surface which is disposed in opposing relationship with the surface of the pushbutton slide 4 and including a transversely extending bracket 9, a cam plate 10 pivotally mounted on the body member 8 and assuming a position which can be adjusted, a locking lever 12 mounted on a pin 11 secured to the bracket 9 for locking the position of the cam plate 10, and an extension member 13 slidably mounted on the body member 8 and having a wedge-shaped portion 14 for causing the locking lever 12 to lock the cam plate 10. The body member 8 is formed with a notch 15, the rear end of which is normally engaged by a rear end 16 of the extension member 13, whereby the extension member 13 is only forwardly slidable relative to the body member 8 within an extent limited by the abutment of the rear end 16 against the other end of the notch 15. The body member 8 includes a portion 17 of a reduced width which is in sliding engagement with the rear vertical wall 3, and a coiled spring 18 (FIG. 2) is disposed on the portion 17 for urging the body member 8 in the forward direction, whereby the tuning slide assemblies 6, 7 remain in their inoperative position in which a projection 19 on the body member 8 bears against the front wall 2.

Figure 3:
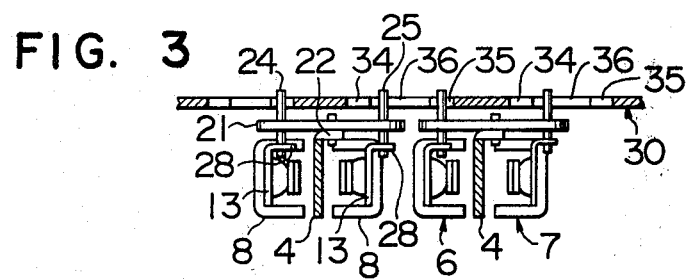
FIG. 3 is a cross section substantially taken along the line 3—3 shown in FIG. 2, it being understood that for purpose of illustration, the parts are not shown in exact disposition.

In the embodiment shown, the pair of tuning slide assemblies 6, 7 are operatively connected with each associated pushbutton slide 4 by connecting means in the form of a single common lever 21. The connecting lever 21 is pivotally mounted on a pin 23 secured to a tongue 22 (FIG. 3) transversely extending from the upper surface of the pushbutton slide 4, with the opposite ends of the lever extending into the region of the respective tuning slide assemblies 6, 7 and having slots 26, 27 formed therein for engagement with pins 24, 25 fixedly mounted on the individual tuning slide assemblies 6, 7. Each of the pins 24, 25 is fixedly mounted on a tongue 28 (FIG. 3) which transversely extends from the forward end of the extension member 13, and passes through the individual slot 26 or 27 in the connecting lever 21 to extend upwardly. Each of the pushbutton slides 4 is operatively associated with the pair of tuning slide assemblies 6, 7 by the connecting lever 21 in the manner mentioned above, thus forming a pushbutton actuator unit.

A conventional dual band pushbutton tuner includes five pushbutton actuator units, which share a single constraining plate 30. The constraining plate 30 is L-shaped in cross section having a portion 31 which extends horizontally over the front portion of the respective pushbutton actuator units and another portion 32 which depends upwardly from the rear end of the portion 31. The depending portion 32 is formed with slots 29 which are engaged by a pair of support pins 33 secured to the front wall 2 so as to mount the constraining plate for lengthwise movement between a pair of its operative positions. The horizontal portion 31 of the constraining plate 30 is formed with a plurality of detent notches 34, 35, each associated with a pair of tuning slide assemblies 6, 7, in order to alternately constrain the pair of assemblies 6, 7 of the respective pushbutton actuator units. The respective detent notches 34, 35 open into an aperture 36 which extends lengthwise of the associated tuning slide assemblies. The pair of tuning slide assemblies 6, 7 of each pushbutton actuator unit has a relation with the constraining plate 30 such that in one operative position of the constraining plate 30, one of the pins 24, 25 engages with one of the detent notches 34, 35 while the other engages the aperture 36, but in the other operative position of the constraining plate 30, the opposite pin engages the remaining detent notch. A knob 37 for operating the constraining plate 30 is formed as an extension from the horizontal portion 31 so as to extend over one of the pushbuttons 5. Thus, an operator can hold the knob 37 between his fingers to move the constraining plate 30 from one of its operative positions to the other alternately. In order to hold the constraining plate 30 temporary in one of these operating positions, a snap action spring 38 of a known form is disposed between the plate 30 and the front wall 2. A band changing switch 39 is mounted on the front wall 2 so as to be actuated in connection with the movement of the constraining plate 30.

In the quiesent state of the dual band pushbutton tuner, each of the pushbutton actuator units assumes its inoperative position shown in FIG. 1. Since the constraining plate 30 is maintained in one of its operative positions, the pin 24 on a selected one of the tuning slide assemblies, slide assembly 6 in the present example, engages the detent notch 35 while the other pin 25 is situated within the aperture 36. However, when the constraining plate 30 is shifted under this condition to its other operative position, the pin 24 is moved into the aperture 36 while the other pin 25 on the slide assembly 7 is engaged with the detent notch 34. When a particular pushbutton 5 is depressed, or moved rearwardly (upwardly as viewed in FIG. 1), the connecting lever 21 which is pivotally mounted on the pin 23 of the corresponding pushbutton slide 4 will angularly move about the pin 23 while maintaining sliding engagement of one of its slots 26 with the pin 24 of the tuning slide assembly 6 which is constrained by the detent notch 35 of the constraining plate 30 and while maintaining sliding engagement of the other slot 27 with the pin 25 on the other tuning slide assembly 7 which is freely movable within the aperture 36 formed in the constraining plate 30. As a consequence, the pushbutton slide 4 is permitted to move from its inoperative position shown in FIG. 1 to its operative position (shown for the left-hand slide 4 of FIG. 2). It also permits the other tuning slide assembly 7 alone to move from its inoperative position shown in FIG. 1 to its operative position shown for the left-hand unit of FIG. 2 while constraining the tuning slide assembly 6. Since the movement of the pushbutton slide 4 is transmitted to the tuning slide assembly 7 with a mechanical advantage gained by the connecting lever 21, the stroke through which the pushbutton 4 must travel may be nearly one-half that required for the tuning slide assembly 7. When the pushbutton 5 is released, the pushbutton slide 4 and the tuning slide assembly 7 are resiliently urged to move in the opposite directions, thus returning to their respective inoperative positions. This manner of operation takes place alternately between the pair of tuning slide assemblies 6, 7, as the constraining plate 30 is shifted to the other operative position.

In this manner, by moving the desired tuning slide assembly 6 or 7 of a selected pushbutton actuator unit between its inoperative and its operative position, a tuning to a particular frequency within a predetermined band is obtained in the dual band pushbutton tuner. Such a manner of operation is well known in the art and is not considered necessary to be described in detail. However, briefly, when a selected tuning slide assembly 6 or 7 of a selected pushbutton actuator unit is moved from its inoperative to its operative position in response to an operation of the pushbutton slide 4, the cam plate 10 of the selected tuning slide assembly 6 or 7 causes a pair of parallel rods 40 carried by rocking arms 47, 47 of the tuning members to move to a predetermined orientation. The rods 40 are disposed to extend across all of the tuning slide assemblies so as to be selectively engageable with any pair of tuning slide assemblies. The predetermined orientation of the cam plate 10 corresponds to a particular frequency which it is desired to receive. In this manner, the rods 40 are moved to a position corresponding to a particular frequency which is to be received, and the movement of the rods 40 operates on a movable plate 43 carrying a plurality of armatures 42 which are telescoped into a plurality of tuning coils 41. The rods 40 can be adjusted to positions corresponding to any desired frequencies to be received, by a manually operated shaft 46 which is connected through a oneway clutch 44 and a transmission shaft 45 with a driven shaft 48. However, when the selected tuning slide assembly 6 or 7 is moved to its operative position, the clutch 44 is released by a trip member 49 before the selected assembly reaches its operative position.

The cam plates 10 of the individual tuning slide assemblies can be positioned to predetermined orientations corresponding to particular frequencies which are desired to be received. Specifically, in the quiesent state of the individual pushbutton actuator units, a particular pushbutton slide 4 is pulled forwardly, whereby it is permitted to move to its reset position (shown for the right-hand slide 4 of FIG. 2) in the same way as it is moved rearwardly. In this instance, no action occurs in the tuning slide assembly 6 for the reason mentioned before, while in the other tuning slide assembly 7, the extension member 13 alone is pulled forwardly as the slide 4 moves. Thereupon, the wedge-shaped portion 14 moves away from the locking lever 12, thus releasing the cam plate 10. When the pushbutton slide 4 is moved from its reset to its operative position subsequently, the tuning slide assembly 7 including the cam plate 10 which is reset is moved to its operative position, thereby allowing the cam plate 10 to be oriented to a position corresponding to a particular frequency, by a conventional procedure. The resetting and adjusting of the cam plate 10 may take place in the alternate tuning slide assembly by moving the constraining plate 10 to the other operative position.

Figure 4:
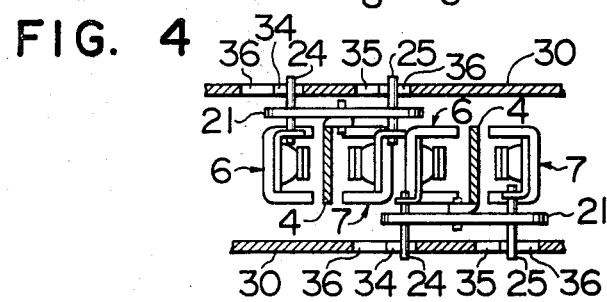
FIG. 4 is a cross section of a dual band pushbutton tuner which is similar to the one shown in FIG. 3 except a pair of constraining plates are provided for ganged movement in conjunction with the arrangement of connecting levers of two adjacent pushbutton actuator units.

In a dual band pushbutton tuner shown in FIG. 4, the connecting lever 21 of one pushbutton actuator unit is located on the opposite side from the connecting lever 21 which is associated with the adjacent pushbutton actuator unit. In this connection, a pair of ganged constraining plates 30, 30 are provided. The pair of constraining plates 30, 30 may comprise a pair of parallel portions of a channel-shaped member. As compared with the arrangement of FIG. 3, the dual band pushbutton tuner of this form may advantageously reduce the spacing between the individual pushbutton actuator units.

Figure 5:
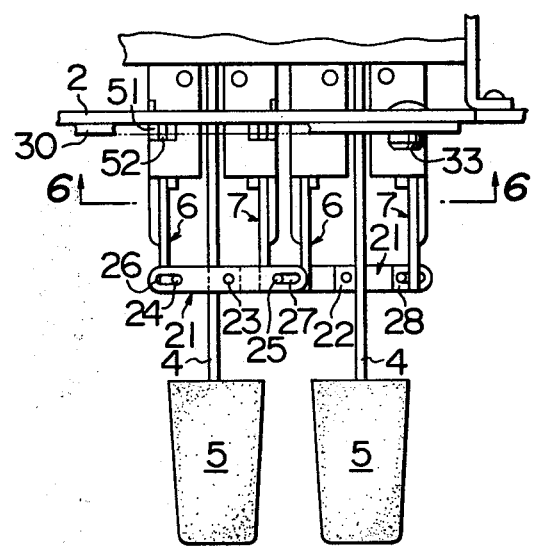
FIG. 5 is a plan view of a modification of the dual band pushbutton tuner shown in FIG. 1, illustrating a modified constraining plate.

FIG. 5 illustrates another form of constraining plate 30 which is associated with a plurality of pushbutton actuator units arranged in the similar manner as in FIG. 4. As will be evident from FIG. 6, the constraining plate 30 comprises a flat member having detent tabs 50 which are adapted to constrain the pair of tuner slide assemblies 6, 7 in an alternate fashion. One detent tab 50 may be each associated with the individual tuning slide assemblies 6, 7, or alternatively one detent tab may be shared by adjacent pushbutton actuator units. Each of the detent tabs 50 selectively engages a notch 51 formed in the body member 8 of the corresponding tuning slide assembly and a notch 52 formed in the extension member 13 in alignment with the notch 51 (see FIG. 5). When the constraining plate 30 shifts to one of its operative positions, one of the tuning slide assemblies 6, 7 is constrained while in the other operative position of the constraining plate 30, the other tuning slide assembly is constrained. In either operative position, the detent notch 50 of the constraining plate 30 engages the both notches 51 and 52 of the associated tuning slide assembly, thus preventing it from being moved to its operative or reset position. This form of constraining plate 30 does not include a horizontal portion of substantial area as in the arrangement of FIG. 1, thereby advantageously reducing the size of the forward portion of the pushbutton actuator units. It will be noted that this form of constraining plate 30 may be similarly applied to the pushbutton actuator units shown in FIGS. 1 to 3.

Figure 6:
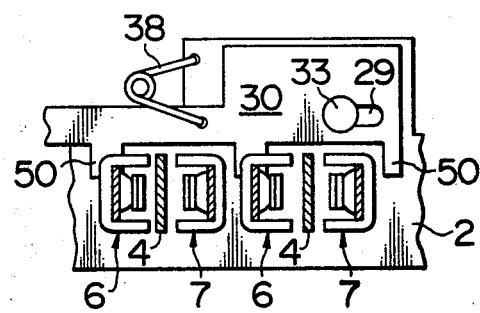
FIG. 6 is a cross section taken along the line 6—6 shown in FIG. 5.
Figure 7:
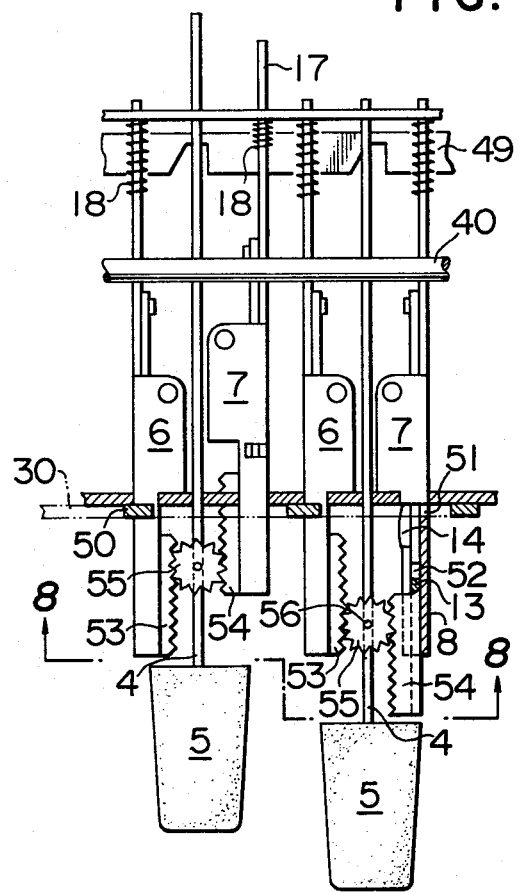
FIG. 7 is a plan view of two adjacent pushbutton actuator units in their operative and reset positions, respectively, of a dual band pushbutton tuner which is slightly different from that shown in FIG. 1.
Figure 8:
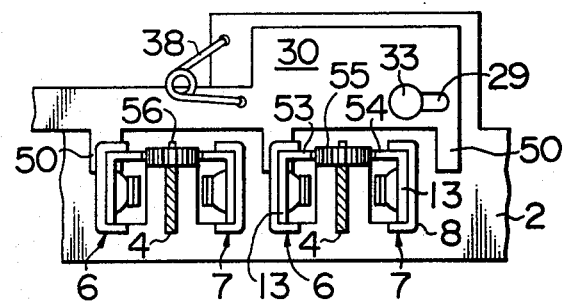
FIG. 8 is a cross section taken along the line 8—8 shown in FIG. 7.

FIG. 7 shows a further dual band pushbutton tuner in which the connecting lever shown in FIG. 1 is replaced by the combination of a pair of racks 53, 54 and a pinion 55. As will be evident from FIG. 8, the pair of racks 53, 54 are mounted on the extension members 13 of the pair of tuning slide assemblies 6, 7, and each mesh with the pinion 55. The pinion 55 is rotatably mounted on a shaft 56 which is secured to the pushbutton slide 4. A constraining plate 30 of the same form as shown in FIGS. 5 and 6 is used in the pushbutton tuner, and accordingly notches 51, 52 are formed in the body member 8 and extension member 3 of the respective tuning slide assemblies for engagement with the detent tabs 50 of the constraining plate 30. The operation is similar to the arrangement of FIG. 1 except that no mechanical advantage is gained by the pinion 55 because of its incremental rotation by engagement with either rack 53 or 54 in contradistinction to the connecting lever 21 used in the tuner of FIG. 1 which has its one end substantially fixed for movement about the stationary pin 23 so as to amplify the movement of the pushbutton slide 4.

Figure 9:
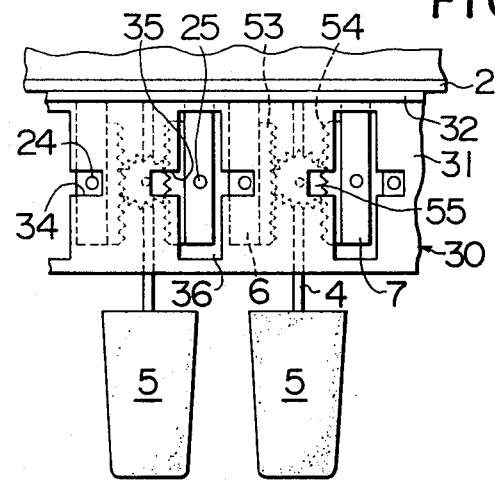
FIG. 9 is a plan view of a dual band pushbutton tuner which is similar to the one shown in FIG. 7, but having a different constraining plate.

FIG. 9 shows an additional dual band pushbutton tuner which is substantially similar to the one shown in FIG. 7 except for the form of the constraining plate 30. In this instance, the constraining plate 30 includes a pair of detent notches 34, 35 for selective engagement with pins 24, 25 extending from the extension members 13 of the tuning slide assemblies 6, 7, and an aperture 36 into which the notches open, generally in the similar manner as shown in FIG. 1.

Figure 10:
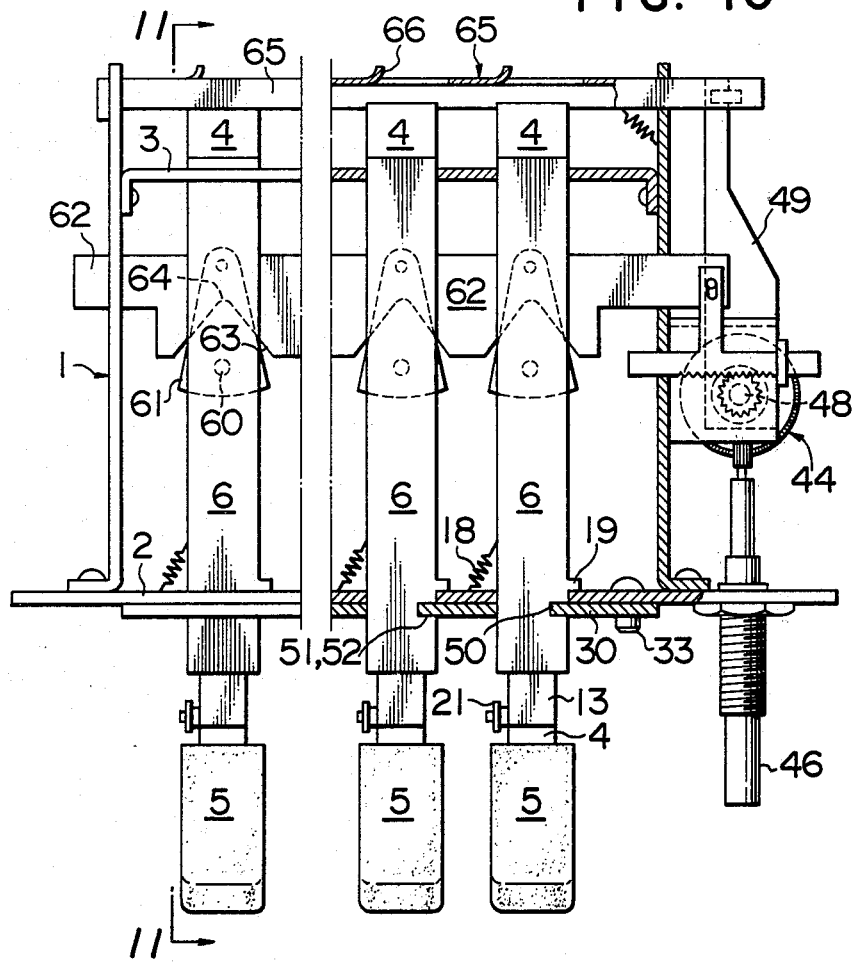
FIG. 10 is a plan view of another dual band pushbutton tuner which is designed to operate on a different tuning scheme from the arrangement of FIG. 1.
Figure 11:
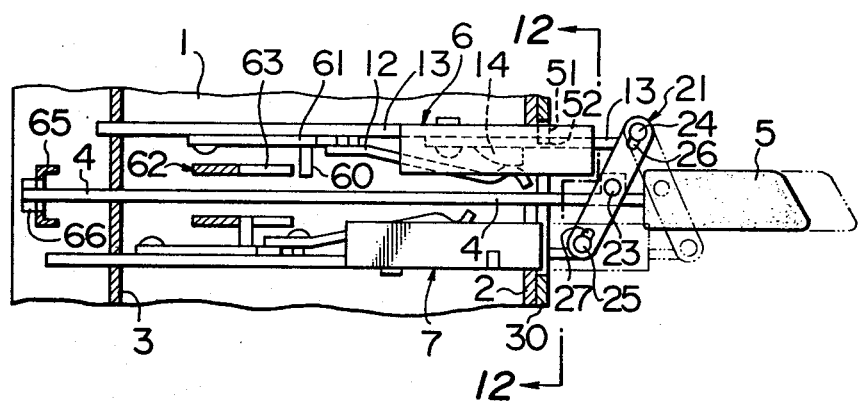
FIG. 11 is a cross section taken along the line 11—11 shown in FIG. 10.
Figure 12:
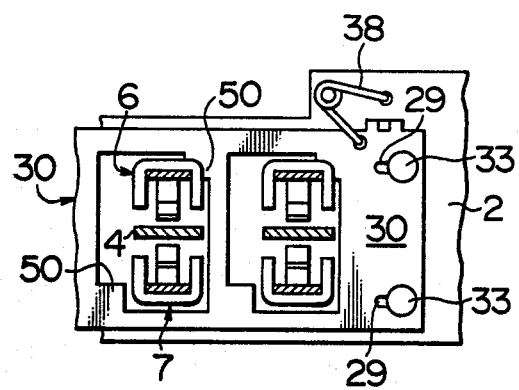
FIG. 12 is a cross section taken along the line 12—12 shown in FIG. 11.

FIGS. 10 to 12 show the application of the principle of the invention to a dual band pushbutton tuner which is designed to operate on a different tuning scheme from that of preceding embodiments. In this embodiment, respective pushbutton slides 4 are slidably mounted on the front and rear walls 2, 3 of the support 1 with their flat surfaces located horizontally. The pair of tuning slide assemblies 6, 7 associated with each pushbutton slide are located above and below the latter in opposing relationship therewith. The assemblies are connected with the slide 4 by a connecting lever 21 which is pivotally mounted on a pin 23 which extends vertically from a lateral extension of the slide 4, generally in the similar manner as in the arrangement of FIG. 1. Hence, it will not be described in detail. The embodiment includes a constraining plate 30 which is similar to that shown in FIG. 6 or 8 except for the shape and disposition of the detent tabs 50. In connection therewith, notches adapted to engage these tabs 50 are formed in the body member 8 and extension member 13 of the respective tuning slide assemblies in the similar manner as before.

A dual band pushbutton tuner which operates on the tuning scheme adapted in the present embodiment has been previously proposed in a preceding application Ser. No. 673,119.

In accordance with the dual band pushbutton tuner, each of the tuning slide assemblies 6, 7 carries a control plate 61 equal to a known cam plate thereon which is provided with an upstanding pin 60, which is in turn located within one of recesses or apertures 63 formed in a movable plate 62 disposed across the array of slides, the recesses being associated one each with the individual tuning slide assemblies. The recess or aperture 63 defines a V-shaped cam edge. When a selected tuning slide assembly is moved to its operative position, the pin thereon engages the cam edge of the corresponding recess or aperture 63 and moves toward the apex 64 of the cam edge, whereby the movable plate 62 shifts to a predetermined position corresponding to a desired frequency to be received. The control plate 61 can be adjusted in either position or orientation to adjust a particular tuning slide assembly to a particular tuning frequency, but is normally locked by a locking member 12. The locking member 12 mounted on the slide body 8 is connected with an extension member 13 having a wedge portion at one end which functions to engage said locking member with the control plate 61. The extension member 13 is slidably mounted on the slide body 8 and is provided with a pin 24 or 25 which engages the connecting lever 21 at its other end. When the pushbutton slide 4 is pulled forwardly to a reset position, only the extension member is allowed to move, thereby disengaging the wedge portion 14 from the locking member 12 and unlocking the control plate 61.

The movable plate 62 can be also adjusted to a position corresponding to a desired reception frequency, by a manually rotatable knob 46 which acts through a clutch 44. When the movable plate 62 assumes an adjusted position, the depression of a tuning slide assembly which carries the unlocked control plate 61 causes a movement of the upstanding pin 60 which is located in accordance with the cam edge of the corresponding recess or aperture 63, whereby the control plate 61 is positioned. A further depression of the pushbutton 5 after the tuning slide assembly has reached its operative position causes the extension member to move over the slide 8, thereby locking the control plate 61 again.

In this manner, each of the control plates 61 on a series of tuning slide assemblies is positioned so as to achieve a tuning with a particular frequency. In accordance with the invention, the movable plate 62 is temporarily secured in position during such positioning process of the control plate in order to assure a predetermined position of the movable plate. As mentioned previously, the movable plate 62 is connected with a driven shaft 48 of the clutch 44. During operation of the clutch 44, rotation is not transmitted from the driven shaft 48 to the driving shaft 46, and the driven shaft 48 is constrained. In accordance with the invention, there is provided a shift plate 65 which is adapted to move in a direction parallel to the movable plate 62, and which functions to release the clutch 44 after the positioning of the control plates 61 is substantially completed. As a result, the problem associated with a possible movement of the movable plate 62 during the positioning of the control plates 61 with consequent improper adjustment to unintended frequencies is avoided. The shift plate 65 functions, during a normal operation of the pushbutton slide 4, to release the clutch 44 before the tuning slide assembly reaches its operative position. The shift plate 65 is provided with cams 66, one each for the respective pushbutton slides 4, each of which serves to drive the shift plate as a selected pushbutton slide 4 is depressed from its inoperative toward its operative position. In this manner, the movable plate of the respective tuning slides 6, 7 can be moved to a position corresponding to a particular frequency to be received.

Having thus described the invention, what is claimed is:

1. A dual band pushbutton tuner comprising:

a support, a pushbutton slide mounted on the support so as to be movable between its inoperative and its operative position and normally urged to its inoperative position, a pair of tuning slide assemblies disposed on the opposite sides of the pushbutton slide and mounted on the support so as to be movable independently of each other between their inoperative and operative positions in conjunction with movement of the pushbutton slide, connecting means for connecting together the pair of tuning slide assemblies so that one of the tuning slide assemblies is movable independently from the other, means mounting the connecting means for pivotal movement on the pushbutton slide, and means coacting with the connecting means for selectively constraining one of the pair of tuning slide assemblies while enabling independent movement of the other.

2. A dual band pushbutton tuner according to claim 1 in which each of the pair of the tuning slide assemblies carries a pin, said connecting means comprising a lever the opposite ends of which have slots for engagement with respective ones of the pins, and said mounting means comprising a pin mounted on the lever on the pushbutton slide.

3. A dual band pushbutton tuner according to claim 1 in which the connection means comprises a pair of racks each carried by the respective tuning slide assemblies, and a pinion pivotally mounted on the pushbutton slide and meshing with each of the racks.

4. A dual band pushbutton tuner according to claim 1 in which the pair of tuning slide assemblies each carry a pin, and wherein the means for constraining includes a plate member mounted on the support so as to be movable to traverse across the pair of tuning slide assemblies, the plate having detent notches for alternate engagement with one or the other of the pins.

5. A dual band pushbutton tuner according to claim 1 in which the pair of tuning slide assemblies is each formed with a notch, and wherein the constraining means includes a plate member mounted on the support so as to be movable to traverse across the pair of tuning slide assemblies, the member including detent tabs for alternate engagement with one or the other of the notches.

6. A dual band pushbutton tuner according to claim 2 in which the means for constraining includes a plate member mounted on the support so as to be slidable in a direction to traverse across the pair of tuning slide assemblies, the plate member being formed with detent notches for alternate engagement with one or the other of the pins carried by the tuning slide assemblies.

7. A dual band pushbutton tuner according to claim 1 in which the pair of tuning slide assemblies are disposed laterally on the opposite sides of the pushbutton slide.

8. A dual band pushbutton tuner according to claim 1 in which the pair of tuning slide assemblies are disposed vertically on the opposite sides of the pushbutton slide.

9. A dual band pushbutton tuner according to claim 1 in which each of the pair of tuning slide assemblies comprises a body member slidably mounted on the support, a cam member pivotally mounted on the body member and assuming an adjustable position, a locking member mounted on the body member for locking the cam member, and an extension member mounted on the body member to be slidable to a limited extent and having means for controlling the locking member, and wherein the connecting means is connected with the pushbutton slide on the extension member, said means for constraining having means for constraining the extension member.

10. In a dual band pushbutton tuner of the type having at least one pushbutton slide mounted for movement between inoperative and operative positions and being normally urged to its inoperative position:

a pair of tuning slide assemblies disposed on opposite sides of said pushbutton slide and mounted for movement independently of each other between their respective inoperative and operative positions in conjunction with movement of said pushbutton slide; connecting means mounted on said pushbutton slide interconnecting said pair of tuning slide assemblies to effect movement of alternative ones of said pair of tuning slide assemblies between its inoperative and operative positions independently of movement of the other of said pair in response to corresponding movement of said pushbutton slide when said other tuning slide assembly is constrained from undergoing movement; and means coacting with said connecting means for selectively constraining from movement each of said pair of tuning slide assemblies.

11. A dual band pushbutton tuner according to claim 10; wherein said connecting means comprises a connecting lever pivotally mounted on said pushbutton slide and having an elongate slot at each lever end, and a pin carried by each of said pair of tuning slide assemblies in slidable engagement with respective ones of the elongate slots to thereby permit independent movement of said pair of tuning slide assemblies.

12. A dual band pushbutton tuner according to claim 10; wherein said pair of tuning slide assemblies each carry a pin; and wherein said means coacting with said connecting means comprises a constraining plate member mounted for movement transverse to the directions of movement of said pair of tuning slide assemblies and having detent notches for engagement with respective ones of said pins depending upon the transverse position of said constraining plate member to thereby constrain from movement that tuning slide assembly whose pin makes engagement with its associated detent notch.

13. A dual band pushbutton tuner according to claim 10; wherein said connecting means includes means for effecting movement of alternative ones of said pair of tuning slide assemblies at a predetermined mechanical advantage with respect to the extent of movement of said pushbutton slide.

* * * * *